(12) United States Patent
Minami (10) Patent No.: US 12,422,790 B2
(45) Date of Patent: Sep. 23, 2025

(54) CONTROL SYSTEM, AND CRANE

(71) Applicant: TADANO LTD., Kagawa (JP)

(72) Inventor: Yoshimasa Minami, Kagawa (JP)

(73) Assignee: TADANO LTD., Kagawa (JP)

( * ) Notice: Subject to any disclaimer, the term of this patent is extended or adjusted under 35 U.S.C. 154(b) by 104 days.

(21) Appl. No.: 17/766,933

(22) PCT Filed: Oct. 12, 2020

(86) PCT No.: PCT/JP2020/038521
§ 371 (c)(1),
(2) Date: Apr. 6, 2022

(87) PCT Pub. No.: WO2021/070971
PCT Pub. Date: Apr. 15, 2021

(65) Prior Publication Data
US 2024/0077840 A1    Mar. 7, 2024

(30) Foreign Application Priority Data

Oct. 11, 2019  (JP) ................................. 2019-187994

(51) Int. Cl.
*G05B 13/00* (2006.01)
*B66C 13/46* (2006.01)
(Continued)

(52) U.S. Cl.
CPC ............ *G05B 13/027* (2013.01); *B66C 13/46* (2013.01); *B66C 13/48* (2013.01); *H03H 17/02* (2013.01)

(58) Field of Classification Search
CPC .......... B66C 13/46; B66C 13/48; H03H 17/02
See application file for complete search history.

(56) References Cited

U.S. PATENT DOCUMENTS 6,442,439 B1    8/2002  Robinett, III et al.
2012/0143399 A1*  6/2012  Noumura ............. B60W 30/02
                                                  701/1
(Continued)

FOREIGN PATENT DOCUMENTS

JP    H07-081876 A    3/1995
JP    2010-228905 A   10/2010
(Continued)

OTHER PUBLICATIONS

Sep. 28, 2023, European Search Report issued for related EP Application No. 20873427.7.
(Continued)

*Primary Examiner* — Adnan M Mirza
(74) *Attorney, Agent, or Firm* — Paratus Law Group, PLLC (57) ABSTRACT

This control system for controlling an actuator of a crane is provided with a signal processing unit for generating a signal related to a target operating amount of the actuator, a feedback control unit for controlling the actuator on the basis of the difference between the signal relating to the target operating amount, and a fed-back signal relating to the operating amount of the actuator, and a feed-forward control unit which controls the actuator on the basis of the signal relating to the target operating amount, in cooperation with the feedback control unit, and learns the characteristics of the actuator by adjusting a weighting factor on the basis of a teaching signal, wherein the signal processing unit converts an input signal into the signal relating to the target operating amount by removing a pulse-shaped component from the input signal.

10 Claims, 8 Drawing Sheets

(51) Int. Cl.
    *B66C 13/48*     (2006.01)
    *G05B 13/02*     (2006.01)
    *H03H 17/02*     (2006.01)

(56) References Cited

U.S. PATENT DOCUMENTS

| | | |
|---|---|---|
| 2015/0090507 A1 | 4/2015 | Okada et al. |
| 2018/0284703 A1 | 10/2018 | Sonoda et al. |
| 2020/0327403 A1* | 10/2020 | Du .................. G02B 27/12 |
| 2021/0039923 A1 | 2/2021 | Minami |

FOREIGN PATENT DOCUMENTS

| | | | |
|---|---|---|---|
| JP | 2018092279 A | * | 6/2018 |
| JP | 2019-156609 A | | 9/2019 |
| WO | WO 2013/190821 A1 | | 12/2013 |

OTHER PUBLICATIONS

Dec. 15, 2020, International Search Report issued for related PCT application No. PCT/JP2020/038521.
Dec. 15, 2020, International Search Opinion issued for related PCT application No. PCT/JP2020/038521.

* cited by examiner

CONTROL SYSTEM, AND CRANE

CROSS REFERENCE TO PRIOR APPLICATION

This application is a National Stage Patent Application of PCT International Patent Application No. PCT/JP2020/038521 (filed on Oct. 12, 2020) under 35 U.S.C. § 371, which claims priority to Japanese Patent Application No. 2019-187994 (filed on Oct. 11, 2019), which are all hereby incorporated by reference in their entirety.

TECHNICAL FIELD

The present invention relates to a control system and a crane.

BACKGROUND ART

Conventionally, in mobile cranes or the like, there has been known a crane in which each of actuators is operated by an operation terminal or the like. Such a crane is operated by an operation command signal on the basis of a load from the operation terminal. Thus, the operator can intuitively operate each of the actuators without being conscious of an operating speed, an operating amount, an operating timing, and the like of each of the actuators (see Patent Literature 1).

In the case of a crane described in Patent Literature 1, a speed signal related to an operation speed of an operation tool in an operation terminal and a direction signal related to an operation direction are transmitted from the operation terminal to the crane. Thus, at a start or stop of movement at which the speed signal from the operation terminal is input to the crane in the form of a step function, there is a possibility that discontinuous acceleration occurs in the crane to cause swinging of a load. Therefore, a technique is known in which optimal control using a speed and a position of a crane and a swing angular speed and a swing angle of a load as feedback amounts is applied, and the crane is controlled according to a speed signal that achieves positioning of the crane at a target position and minimization of the swing angle of the load by compensation of a lag using a predictive gain (see Patent Literature 2).

The crane described in Patent Literature 2 is controlled on the basis of a predetermined mathematical model of the crane so as to improve the positioning accuracy of the crane and minimize the swinging of the load. Therefore, in a case where the mathematical model has a large error, an error of a future predictive value also becomes large, which causes disadvantages of a decrease of the positioning accuracy of the crane and an increase of the swinging of the load.

CITATION LIST

Patent Literature

Patent Literature 1: JT 2010-228905 A
Patent Literature 2: JP H7-81876 A

SUMMARY OF THE INVENTION

Problems to be Solved by the Invention

An object of the present invention is to provide a crane control system and a crane capable of moving a load in a mode according to an operator's intention while suppressing swinging of a load when an actuator is controlled on the basis of the load.

Solutions to Problems

A problem to be solved by the present invention is as described above, and a means for solving the problem will be described below.

An aspect of a control system according to the present invention is a control system for controlling an actuator of a crane. The control system includes: a signal processing unit that generates a signal related to a target operating amount of the actuator; a feedback control unit that controls the actuator on the basis of a difference between the signal related to the target operating amount and a fed-back signal related to an operating amount of the actuator; and a feed-forward control unit that controls the actuator on the basis of the signal related to the target operating amount in cooperation with the feedback control unit, and adjusts a weighting factor on the basis of a teaching signal, to learn characteristics of the actuator, wherein the signal processing unit removes a pulse-shaped component from an input signal to convert the input signal into the signal related to the target operating amount.

An aspect of a crane according to the present invention includes the above-described control system.

Effects of the Invention

According to the control system of the present invention, the signal related to the target operating amount which is the input signal to the feed-forward control unit does not include the pulse-shaped component. Thus, the learning performed in the feed-forward control unit can be stabilized.

DESCRIPTION OF EMBODIMENTS

Embodiment

Hereinafter, a crane 1, which is a mobile crane (rough terrain crane), as a working vehicle according to an embodiment of the present invention will be described with reference to FIGS. 1 and 2. Note that, although the crane 1 (the rough terrain crane) will be described as the working vehicle in the present embodiment, the working vehicle may be an all-terrain crane, a truck crane, a loading truck crane, or the like. In addition, the present invention is also applicable to a working machine for suspending a load with a wire rope.

Note that, in the following description, "(n), (n+1), and (n+2)" mean pieces of information acquired for the nth time, the (n+1)th time, and the (n+2)th time, respectively, among pieces of information (for example, a fed-out amount of the wire rope) acquired every unit time t. That is, "(n)" means information acquired after a lapse of n×t hours since the start of information acquisition. In addition, "(n+1)" means information acquired after a lapse of (n+1)×t hours since the start of information acquisition. In addition, "(n+2)" means information acquired after a lapse of (n±2)×t hours since the start of information acquisition.

Figure 1:
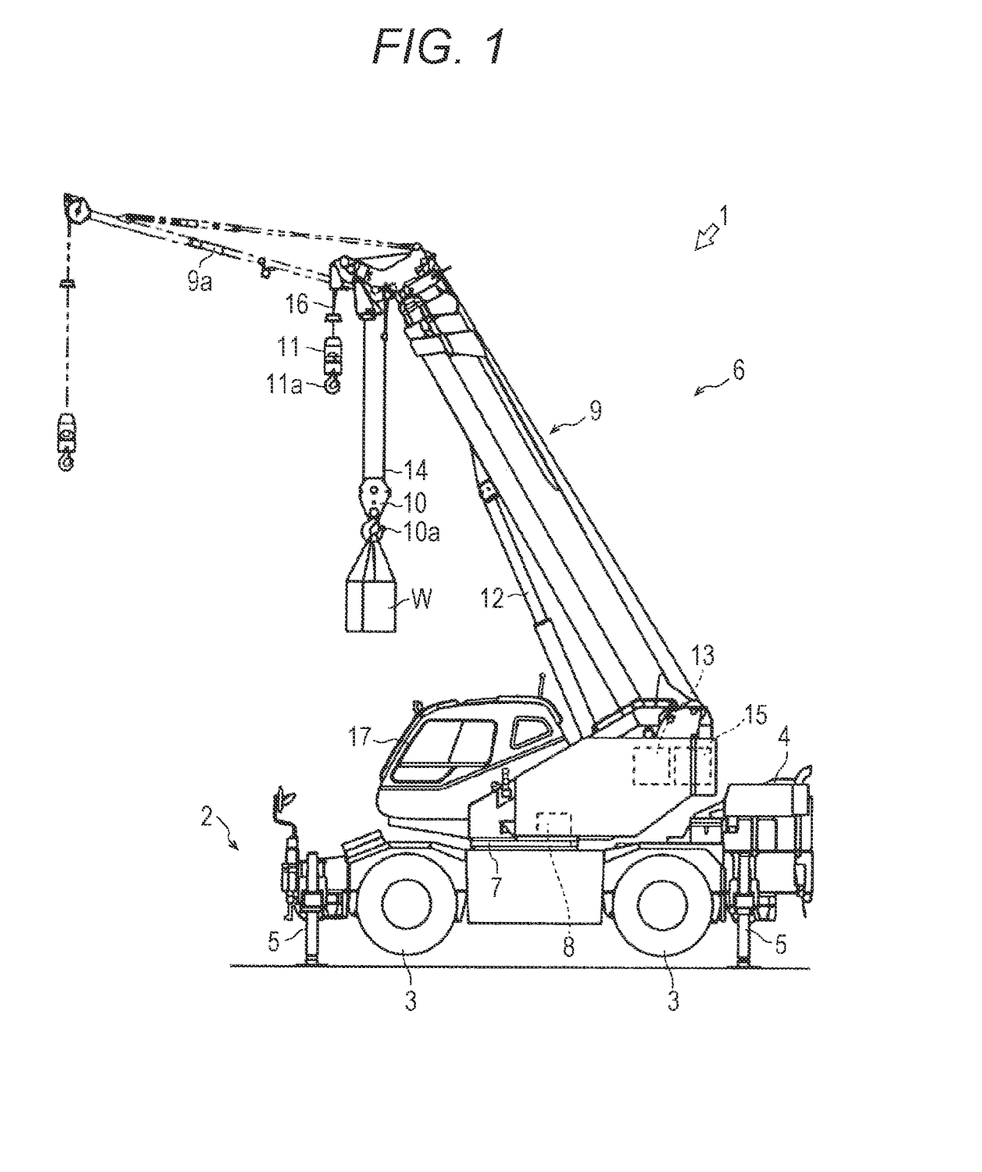
FIG. 1 is a side view illustrating an overall configuration of a crane.

As illustrated in FIG. 1, the crane 1 is the mobile crane that can move to an unspecified place. The crane 1 includes a vehicle 2, a crane device 6 which is a working machine, and a load moving operation tool 32 (see FIG. 2) which can operate the crane device 6 on the basis of a load W.

The vehicle 2 a traveling body that carries the crane device 6. The vehicle 2 has a plurality of wheels 3. The vehicle 2 travels using an engine 4 as a power source. The vehicle 2 is provided with an outrigger 5. The outrigger 5 includes a projecting beam that can be hydraulically extended on both sides in a width direction of the vehicle 2 and a hydraulic jack cylinder that can be extended in a direction perpendicular to the ground. The vehicle 2 can expand an operable range of the crane 1 by extending the outrigger 5 in the width direction of the vehicle 2 and grounding the jack cylinder.

The crane device 6 is a working machine that lifts the load W with a wire rope. The crane device 6 includes a turning base 7, a boom 9, a jib 9a, a main hook block 10, a sub hook block 11, a raising hydraulic cylinder 12, a main winch 13, a main wire rope 14, a sub winch 15, a sub wire rope 16, a cabin 17, and the like.

The turning base 7 is a driving device that allows the crane device 6 to turn. The turning base 7 is provided on a frame of the vehicle 2 via an annular bearing. The turning base 7 is configured to be rotatable about a center of the annular bearing as a center of rotation. The turning base 7 is provided with a hydraulic turning hydraulic motor 8 which is an actuator. The turning base 7 is configured to be capable of turning in one direction and the other direction by the turning hydraulic motor 8.

Turning base cameras 7b, which are load position detection units, are monitoring devices that capture images of an obstacle, a person, and the like around the turning base 7. The turning base cameras 7b are provided on both left and right sides in front of the turning base 7 and on both left and right sides behind the turning base 7. Each of the turning base cameras 7b covers the entire periphery of the turning base 7 as a monitoring range by capturing an image of the periphery of each installation location. In addition, the turning base cameras 7b arranged on both the left and right sides in front of the turning base 7 are configured to be usable as a set of stereo cameras. That is, the turning base cameras 7b in front or the turning base 7 can be configured as the load position detection units that detect position information of the suspended load W by being used as the set of stereo cameras. Note that the load position detection unit (turning base camera 7b) may include a boom camera 9b to be described later. In addition, the load position detection unit is preferably a unit that can detect the position information of the load W such as a millimeter wave radar, an acceleration sensor, and a GNSS.

The turning hydraulic motor 8 is an actuator that is rotationally operated by a turning valve 23 (see FIG. 2) which is an electromagnetic proportional switching valve. The turning valve 23 can control a flow rate of hydraulic oil supplied to the turning hydraulic motor 8 to a freely-selected flow rate. In other words, the turning base 7 is configured to be controllable to a freely-selected turning speed via the turning hydraulic motor 8 rotably operated by the turning valve 23. The turning base 7 is provided with a turning sensor 27 (see FIG. 2) that is turning angle detection unit for detecting a turning angle $\theta z$ (see FIG. 4) and a turning speed of the turning base 7.

The boom 9 is a movable prop that supports the wire rope to a state of being capable of lifting the load W. The boom 9 includes a plurality of boom members. The boom 9 is provided such that a proximal end of a base boom member is swingable substantially at the center of the turning base 7. The boom 9 is configured to be freely elongated/contracted in an axial direction by moving each of the boom members by an elongation/contraction hydraulic cylinder 51 which is an actuator.

In addition, the boom 9 is provided with a jib 9a at a tip. The boom 9 and the jib 9a correspond to an example of an arm portion. The arm portion may be configured using, for example, only the boom 9 out of the boom 9 and the jib 9a. In addition, the arm portion may include the boom 9 and the jib 9a supported by the tip of the boom 9. A tip of the arm portion means the tip of the boom in a case where the mobile crane includes only the boom. On the other hand, the tip of the arm portion means a tip of the jib 9a in a case where the mobile crane includes the boom 9 and the jib 9a.

The elongation/contraction hydraulic cylinder 51 is an actuator that is operated to be elongated/contracted by an elongation/contraction valve 24 (see FIG. 2) which is an electromagnetic proportional switching valve. The elongation/contraction valve 24 can control a flow rate of hydraulic oil supplied to the elongation/contraction hydraulic cylinder 51 to a freely-selected flow rate. The boom 9 is provided with an elongation/contraction sensor 28 which is an elongation/contraction length detection unit that detects a length of the boom 9, and an azimuth sensor 29 that detects an azimuth with on the tip of the boom 9 as a center.

The boom camera 9b (see FIG. 2) is a sensing device that captures images of the load W and features in the vicinity of the load W. The boom camera 9b is provided at the tip of the boom 9. The boom camera 9b is configured to be capable of capturing images of the load W and features or terrain in the vicinity of the crane 1 from vertically above the load W.

The main hook block 10 and the sub hook block 11 are suspenders for suspending the load W. The main hook block 10 is provided with a plurality of hook sheaves around which the main wire rope 14 is wound, and a main hook 10a for suspending the load W. The sub hook block 11 is provided with a sub hook 11a for suspending the load W.

The raising hydraulic cylinder 12 is an actuator that raises and lowers the boom 9 and holds an attitude of the boom 9. In the raising hydraulic cylinder 12, as end of a cylinder portion is swingably connected to the turning base 7, and an end of a rod portion is swingably connected to the base boom member of the boom 9. The raising hydraulic cylinder 12 is operated to be elongated/contracted by a raising valve 25 (see FIG. 2) which is an electromagnetic proportional switching valve. The raising valve 25 can control a flow rate of hydraulic oil supplied to the raising hydraulic cylinder 12 to a freely-selected flow rate. The boom 9 is provided with a raising sensor 30 (see FIG. 2) which is a raising angle detection unit for detecting a raising angle $\theta x$ (see FIG. 4).

The main winch 13 and the sub winch 15 are winding devices that wind up (reel up) and feed out (release) the main wire rope 14 and the sub wire rope 16. The main winch 13 is configured such that a main drum around which the main wire rope 14 is wound is rotated by a main hydraulic motor 52, which is an actuator, and the sub winch 15 is configured such that a sub drum around which the sub wire rope 16 is wound is rotated by a sub hydraulic motor 53 which is an actuator.

The main hydraulic motor 52 is rotationally operated by a main valve 26m (see FIG. 2) which is an electromagnetic proportional switching valve. The main winch 13 is configured such that the main hydraulic motor 52 is controlled by the main valve 26m and can be operated at freely-selected winding-up and feeding-out speeds.

Similarly, the sub winch 15 is configured such that the sub hydraulic motor 53 is controlled by a sub valve 26s (see FIG. 2), which is an electromagnetic proportional switching valve, and can be operated at freely-selected winding-up and feeding-out speeds. Each of the main winch 13 and the sub winch 15 is provided with a winding sensor 33 (see FIG. 2) that detects a fed-out amount l(n) of each of the main wire rope 14 and the sub wire rope 16.

The cabin 17 is an operator's seat covered with a housing. The cabin 17 is mounted on the turning base 7. An operator's seat (not illustrated) is provided. The operator's seat is provided with an operation tool for operating the vehicle 2 to travel, a turning operation tool 18 for operating the crane device 6, a raising operation tool 19, an elongation/contraction operation tool 20, a main drum operation tool 21m, a sub drum operation tool 21s, and the like (see FIG. 2).

The turning operation tool 18 can operate the turning hydraulic motor 8. The raising operation tool 19 can operate the raising hydraulic cylinder 12. The elongation/contraction operation tool 20 can operate the elongation/contraction hydraulic cylinder 51. The main drum operation tool 21m can operate the main hydraulic motor. The sub drum operation tool 21s can operate the sub hydraulic motor 53.

The cabin 17 is provided with the load moving operation tool 32 which is a load moving operation unit for inputting a moving direction and a moving speed of the load W. The load moving operation tool 32 is an operation tool for inputting an instruction regarding the moving direction and speed of the load W on the horizontal plane.

The load moving operation tool 32 includes an operation lever and a sensor (not illustrated) that detects a tilt direction and a tilt amount of the operation lever. The load moving operation tool 32 is configured such that the operation lever can be tilted in any direction. The load moving operation tool 32 is configured to transmit, to a control device 31 (see FIG. 2), an operation signal regarding the tilt direction and the tilt amount of an operation lever detected by the sensor (not illustrated) with a forward direction from a seating direction of the operator's seat (hereinafter, simply referred to as a "forward direction") as an extending direction of the boom 9.

For example, when the load moving operation tool 32 is tilted, by a freely-selected tilt amount, leftward with respect to the forward direction in a direction of a tilt angle θ=45° in a state where the tip of the boom 9 faces the north, the crane 1 moves the load W at a speed corresponding to the tilt amount of the load moving operation tool 32 from the north, which is the extending direction of the boom 9, to the west which is the direction of the tilt angle θ=45°. Note that the load moving operation tool 32 may be provided in a remote operation terminal.

Figure 2:
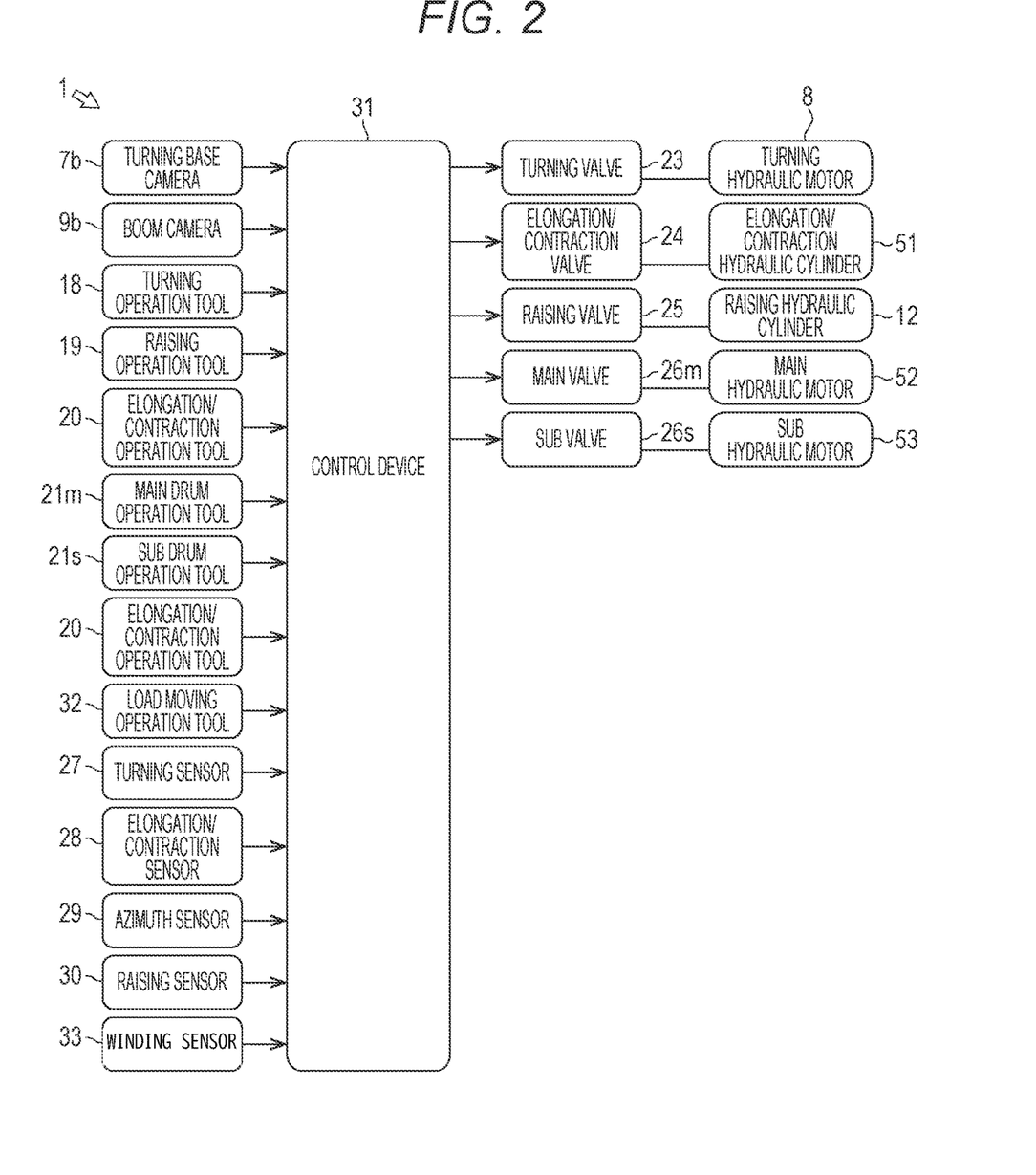
FIG. 2 is a block diagram illustrating a control configuration of the crane.

As illustrated in FIG. 2, the control device 31 the control device 31 that controls an actuator of the crane device 6 via each operation valve. The control device 31 is provided in the cabin 17. In practice, the control device 31 may be configured such that a CPU, a ROM, a RAM, an HDD, and the like are connected via a bus, or may be configured using a one-chip LSI or the like. The control device 31 stores various programs and data in order to control the operations of the respective actuators, switching valves, sensors, and the like.

The control device 31 is connected to the turning base camera 7b, the boom camera 9b, the turning operation tool 18, the raising operation tool 19, the elongation/contraction operation tool 20, the main drum operation tool 21m, and the sub drum operation tool 21s, and can acquire a video from the turning base camera 7b and a video from the boom camera 9b and acquire an operation amount of each of the turning operation tool 18, the raising operation tool 19, the main drum operation tool 21m, and the sub drum operation tool 21s.

The control device 31 is connected to the turning valve 23, the elongation/contraction valve 24, the raising valve 25, the main valve 26m, and the sub valve 26s, and can transfer a target operating signal Md (see FIG. 4), which is a target operating amount of each valve, to the turning valve 23, the raising valve 25, the main valve 26m, and the sub valve 26s.

The control device 31 is connected to the turning sensor 27, the elongation/contraction sensor 28, the azimuth sensor 29, the raising sensor 30, and the winding sensor 33, and can acquire the turning angle θz of the turning base 7, an elongation/contraction length Lb, the raising angle θx, the fed-out amount l(n) and the azimuth of the man wire rope 14 or the sub wire rope 16 (hereinafter, simply referred to as the "wire rope").

The control device 31 generates the target operating signal Md corresponding to each operation tool on the basis of the operating amounts of the turning operation tool 18, the raising operation tool 19, the main drum operation tool 21m, and the sub drum operation tool 21s.

The crane 1 configured in this manner can move the crane device 6 to any position by causing the vehicle 2 to travel. In addition, the crane 1 can increase a lifting height and an operating radius of the crane device 6 by raising the boom 9 at a raising angle θx by the raising hydraulic cylinder 12 with the operation of the raising operation tool 19 and extending the boom 9 to any boom 9 length with the operation of the elongation/contraction operation tool 20. In addition, the crane 1 can carry the load W by lifting the load W with the sub drum operation tool 21s and the like and turning the turning base 7 with the operation of the turning operation tool 18.

The control device 31 computes a target course signal Pdα of the load P on the basis of the azimuth of the tip of the boom 9 acquired by the azimuth sensor 29. Further, the control device 31 computes a target position coordinate p(n+1) of the load W, which is a target position of the load W, from the target course signal Pdα. The control device 31 generates the target operating signals Md of the turning valve 23, the elongation/contraction valve 24, the raising valve 25, the main valve 26m, and the sub valve 26s for moving the load W to the target position coordinate p(n+1) (see FIG. 4).

The crane 1 moves the load W toward the tilt direction of the load moving operation tool 32, at the speed according to the tilt amount. At this time, the crane 1 controls the turning hydraulic motor 8, the elongation/contraction hydraulic cylinder 51, the raising hydraulic cylinder 12, the main hydraulic motor 52, and the like by the target operating signals Md.

With such a configuration, the crane 1 computes a target moving speed signal add, which is a control signal for a target moving speed of the load W including a moving direction corresponding to the operation direction of the load moving operation tool 32 and a moving speed corresponding to the operation amount (tilt amount), for every unit time t and determines the target position coordinate p(n+1) of the load W, using the extending direction of the boom 9 as a reference. Thus, the operator does not lose the recognition of an operating direction of the crane device 6 with respect to the operation direction of the load moving operation tool 32.

That is, the operation direction of the load moving or tool 32 and the moving direction of the load W are computed on the basis of the extending direction of the boom 9 as the common reference. As a result, the crane device 6 can be operated easily and simply. Note that, although the load moving operation tool 32 is provided inside the cabin 17 in the present embodiment, the load moving operation tool 32 may include a terminal-side radio and be provided in a remote operation terminal that can be remotely operated from the outside of the cabin 17.

Next, one embodiment of a control process of computing the target course signal Pdα of the load W for generating the target operating signal Md in the control device 31 of the crane device 6 and a target position coordinate q(n+1) of the tip of the boom 9 will be described with reference to FIGS. 3 to 8.

Figure 3:
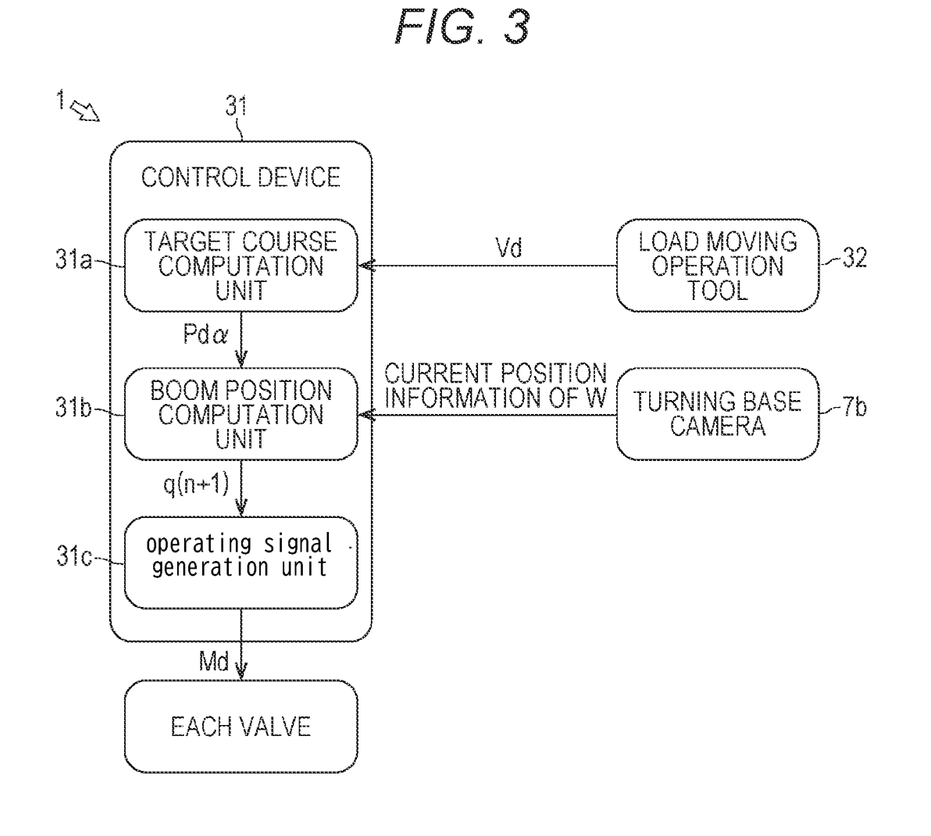
FIG. 3 is a block diagram illustrating a control configuration of a control device according to the present embodiment.

As illustrated in FIG. 3, the control device 31 includes a target course computation unit 31a, a boom position computation unit 31b, and an operating signal generation unit 31c. In addition, the control device 31 is configured to be capable of acquiring current position information of the load W by using a set of the turning base cameras 7b on both the left and right sides in front of the turning base 7 as a stereo camera and as the load position detection unit (see FIG. 2).

As illustrated in FIG. 3, the target course computation unit 31a is a part of the control device 31, and converts the target moving speed signal Vd of the load W into the target course signal Pdα of the load W. The target course computation unit 31a can acquire the target course signal Pdα of the load W including the moving direction and speed of the load W from the load moving operation tool 32 every unit time t.

In addition, the target course computation unit 31a can compute the target course signals Pdα in an x-axis direction, a y-axis direction, and a z-axis direction of the load W every unit time t by integrating the acquired target moving speed signals Vd. Here, the subscript α is a sign representing any of the x-axis direction, the y-axis direction, and the z-axis direction.

The boom position computation unit 31b is a part of the control device 31, and computes a position coordinate of the tip of the boom 9 from attitude information of the boom 9 and the target course signal Pdα of the load W. The boom position computation unit 31b can acquire the target course signal Pdα from the target course computation unit 31a.

The boom position computation unit 31b acquires a turning angle θz(n) of the turning base 7 from the turning sensor 27. The boom position computation unit 31b acquires an elongation/contraction length lb(n) from the elongation/contraction sensor 28. The boom position computation unit 31b acquires a raising angle θx(n) from the raising sensor 30. The boom position computation unit 31b acquires the fed-out amount l(n) of the main wire rope 14 or the sub wire rope 16 (hereinafter, simply referred to as the "wire rope") from the winding sensor 33. The boom position computation unit 31b acquires the current position information of the load W from an image of the load W captured by the set of turning base cameras 7b arranged on the left and right sides in front of the turning base 7 (see FIG. 2).

The boom position computation unit 31b computes the current position coordinate p(n) of the load W from the acquired current position information of the load W. The boom position computation unit 31b computes a current position coordinate q(n) (hereinafter, simply referred to as the "current position coordinate q(n) of the boom 9") of the tip of the boom 9 which is the current position of the tip of the boom 9 (a fed-out position of the wire rope) from the acquired turning angle θz(n), elongation/contraction length lb(n), and raising angle θx(n).

In addition, the boom position computation unit 31b computes the fed-out amount l(n) of the wire rope on the basis of the current position coordinate p(n) of the load W and the current position coordinate q(n) of the boom 9. In addition, the boom position computation unit 31b computes target position coordinate p(n+1) of the load W, which is a position of the load W after a lapse of the unit time t from the target course signal Pdα.

In addition, the boom position computation unit 31b computes a direction vector e(n+1) of the wire rope on which the load W is suspended on the basis of the current position coordinate p(n) of the load W and the target position coordinate p(n+1) of the load W. The boom position computation unit 31b computes the target position coordinate g(n+1) of the boom 9, which is the position of the tip of the boom 9 after a lapse of the unit time t, on the basis of the target position coordinate p(n+1) of the load 9 and the direction vector e(n+1) of the wire rope using an inverse dynamics model.

The operating signal generation unit 31c is a part of the control device 31, and generates the target operating signal Md and the like of each actuator from the target position coordinate q(n+1) of the boom 9 after the lapse of the unit time t. The operating signal generation unit 31c acquires the target position coordinate q(n+1) of the boom 9 after the lapse of the unit time t from boom position computation unit 31b.

The operating signal generation unit 31c generates the target operating signal Md of the turning valve 23, the elongation/contraction valve 24, the raising valve 25, the main valve 26m, or the sub valve 26s, and a feedback operating signal Md1 and a feed-forward operating signal Md2, which will be described later, from the current position coordinate q(n) of the boom 9 and the target position coordinate p(n+1) of the load W.

Figure 4:
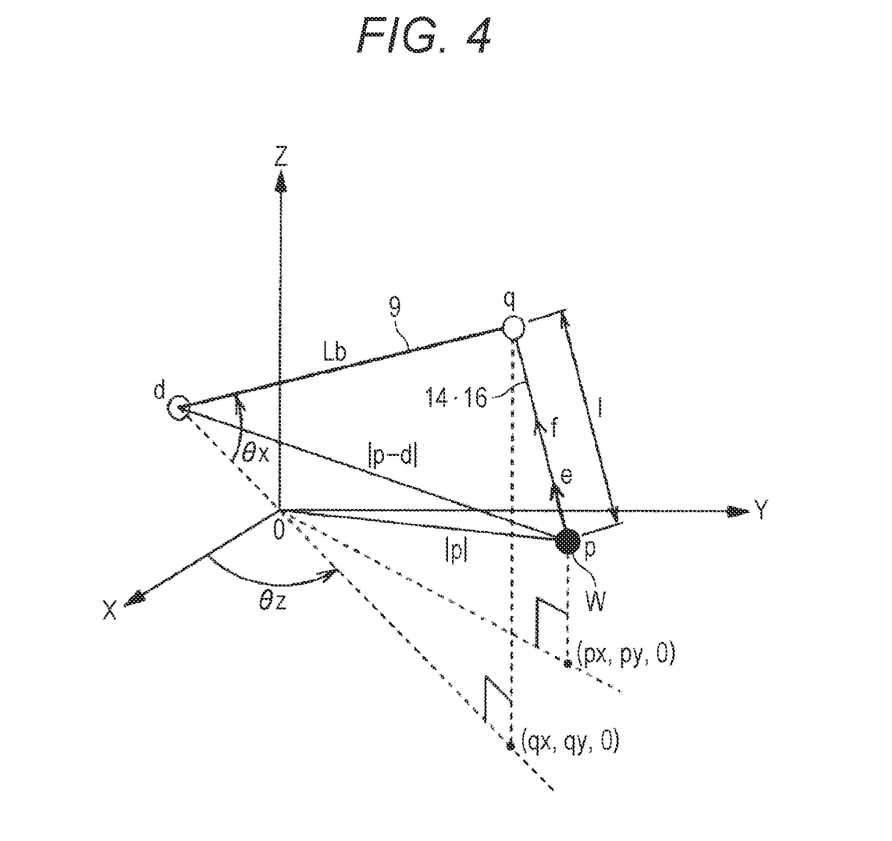
FIG. 4 is a view illustrating an inverse dynamics model of the crane.

Next, the control device 31 determines the inverse dynamics model of the crane 1 for computing the target position coordinate q(n+1) of the tip of the boom 9 as illustrated in FIG. 4. The inverse dynamics model is defined in the XYZ coordinate system, and takes an origin O as a turning center of the crane 1. The control device 31 defines each of q, p, lb, θx, θz, l, f, and e in the inverse dynamics model.

For example, q represents the current position coordinate q(n) of the tip of the boom 9, and p represents, for example, the current position coordinate p(n) of the load W. For example, lb represents the elongation/contraction length lb(n) of the boom 9. For example, θx represents the raising angle θz(n). For example, θz represents the turning angle θz(n). For example, l represents the fed-out amount l(n) of the wire rope. For example, f represents tension f of the wire rope. For example, e represents, for example, a direction vector e(n) of the wire rope.

In the inverse dynamics model defined in this manner, the relationship between a target position q at the tip of the boom 9 and a target position p of the load W is expressed by Formula (2) using the target position p of the load W, a mass m of the load W, and a spring constant kf of the wire rope.

In addition, the target position p of the tip of the boom 9 is computed by Formula (3) that is a function of time for the load W.

[Formula 2]

$$m\ddot{p}=mg+f=mg+k_1(q-p) \quad (2)$$

[Formula 3]

$$q(t)=p(t)+l(t,\alpha)e(t)=q(p(t),\ddot{p}(t),\alpha) \quad (3)$$

f: tension of wire rope, kf: spring constant, m: mass of load W, q: current position or target position of tip of boom 9, p: current position or target position of load W, l: fed-out amount of wire rope, e: direction vector, g: gravitational acceleration The fed-out amount l(n) of the wire rope is computed from the following Formula (4). The fed-out amount l(n) of the wire rope is defined by a distance between the current position coordinate q(n) of the boom 9, which is the position of the tip of the boom 9, and the current position coordinate p(n) of the load F which is the position of the load W.

[Formula 4]

$$l(n)^2=|q(n)-p(n)|^2 \quad (4)$$

The direction vector e(n) of the wire rope is computed from the following Formula (5). The direction vector e(n) of the wire rope is a vector of a unit length of the tension f of the wire rope (see Formula (2)). The tension f of the wire rope is computed by subtracting the gravitational acceleration from the acceleration of the load W computed from the current position coordinate p(n) of the load W and the target position coordinate p(n+1) of the load W after the lapse of the unit time t.

[Formula 5]

$$e(n) = \frac{f}{|f|} = \frac{\ddot{p}(n)-g}{|\ddot{p}(n)-g|} \quad (5)$$

The target position coordinate q(n+1) of the boom 9, which is the target position of the tip of the boom 9 after the lapse of the unit time t, is computed from Formula (6) obtained by expressing Formula (2) as a function of n. Here, a indicates the turning angle θs(n) of the boom 9. The target position coordinate q(n+1) of the boom 9 is computed using the inverse dynamics from the fed-out amount l(n) of the wire rope, the target position coordinate p(n+1) of the load W, and the direction vector e(n+1).

[Formula 6]

$$q(n+1)=p(n+1)+l(n,\alpha)e(t+1)=q(p(n+1),\ddot{p}(n+1),\alpha) \quad (6)$$

Next, the generation of the target operating signal Md (the feedback operating signal Md1 and the feed-forward operating signal Md2) by a control system 34 of the crane 1 including a learning-type inverse dynamics model will be described with reference to FIG. 5.

The crane 1 includes, as the control system 34 of the crane 1, the load moving operation tool 32, the turning sensor 27, the raising sensor 30, the elongation/contraction sensor 28, the turning base cameras 7b, a target value filter 35, a target operating amount computation unit 36, a feedback control unit 37, and a feed-forward control unit 39.

In the control system 34, the target course computation unit 31a, the boom position computation unit 31b, and the operating signal generation unit 31c of the control device 31 cooperate to constitute the feedback control unit 37 and the feed-forward control unit 39 as illustrated in FIG. 4.

Figure 5:
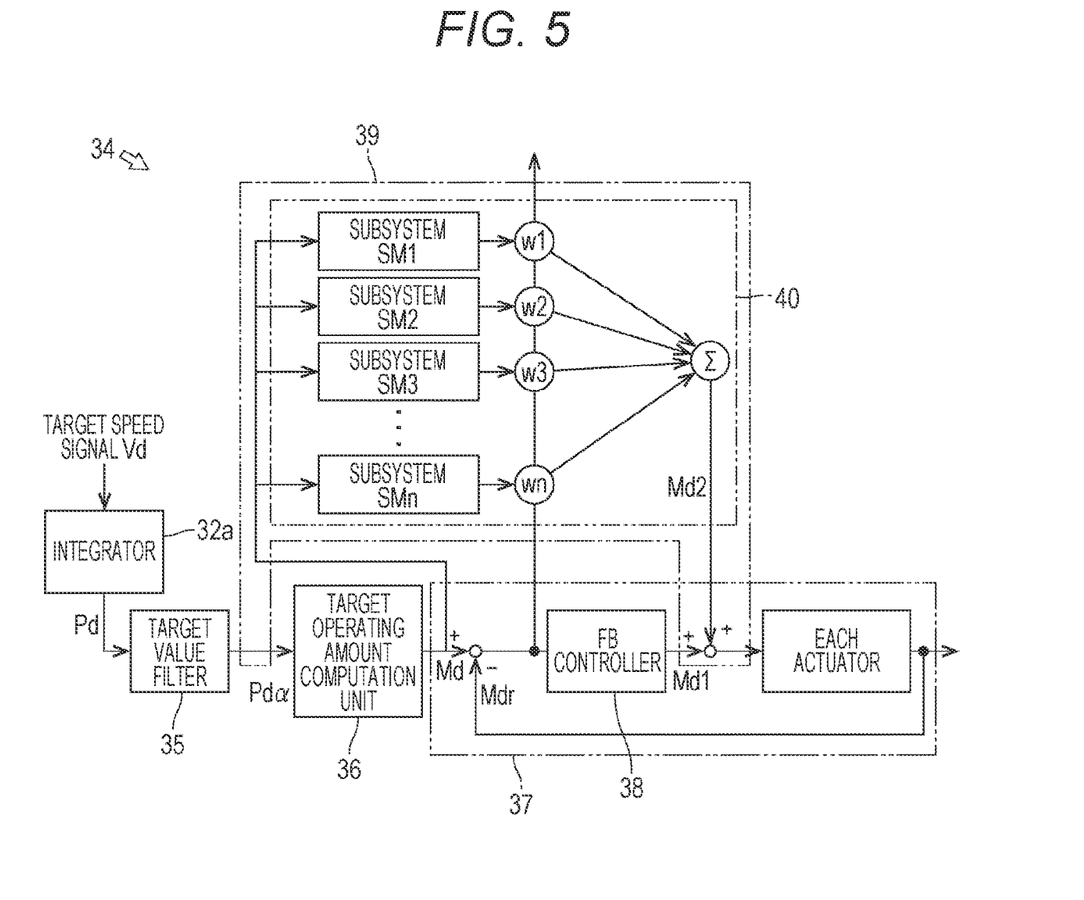
FIG. 5 is a block diagram illustrating a control configuration of the control system according to the present embodiment.

In the present embodiment, the control system 34 is a control system for controlling an actuator of a crane, and includes: a signal processing unit (the target value filter 35 and the target operating amount computation unit 36) that generates a signal related to a target operating amount of the actuator; the feedback control unit 37 that controls the actuator on the basis of a difference between the signal (the target operating signal Md) related to the target operating amount and a fed-back signal (an actual operating signal Mdr) related to an operating amount of the actuator; and the feed-forward control unit 39 that controls the actuator on the basis of the signal (target operating signal Md) related to the target operating amount in cooperation with the feedback control unit 37, and adjusts a weighting factor on the basis of a teaching signal (the difference between the target operating signal Md and the actual operating signal Mdr) to learn characteristics of the actuator as illustrated in FIG. 5. Then, in the case of the control system 34, the signal processing unit (the target value filter 35 and the target operating amount computation unit 36) removes a pulse-shaped component from an input signal (the target movement position signal Pd) to convert the input signal (target movement position signal Pd) into the signal (target operating signal Md) related to the target operating amount.

Specifically, the target value filter 35 computes the target course signal Pdα of the load W from the target movement position signal Pd which is the control signal for the target movement position of the load W as illustrated in FIG. 5. The target value filter 35 corresponds to an example of the signal processing unit and an example of a first processing unit, and attenuates a frequency equal to or higher than a predetermined frequency. The target value filter 35 receives the target movement position signal Pd of the load W obtained by converting the target moving speed signal Vd of the load moving operation tool 32 by an integrator 32a. The integrator 32a corresponds to an example of a pre-processing unit.

The target movement position signal Pd of the load W corresponds to an example of the input signal input to the signal processing unit. The target movement position signal Pd is, for example, a pulse-shaped (step-shaped) signal. When the target value filter 35 is applied, the target movement position signal Pd is converted into the target course signal Pdα from which the pulse-shaped component has been removed. In other words, when the target value filter 35 is applied, the target movement position signal Pd is obtained converted into the target course signal Pdα in which a rapid change in which a time change (in other words, the speed in each axial direction of position coordinates) of a target course has a pulse shape (step shape) is suppressed. Since the target course signal Pdα does not contain the pulse-shaped component, generation of a singular point (rapid position variation) due to a differential operation in the feed-forward control unit 39 is suppressed. The target value filter 35 is a low-pass filter including a transfer function G(s) of Formula (1). The transfer function G (s) is expressed in a format of a partial fraction decomposition where T1, T2, T3, T4, C1, C2, C3, and C4 are coefficients and s is a differential element.

The transfer function G(s) of Formula (1) is set for each of the x axis, the y axis, and the z axis. In this manner, the transfer function G(s) can be expressed as a superposition of the transfer functions with the first-order lag. The target value filter 35 converts the target movement position signal Pd into the target coarse signal Pdα by multiplying the target movement position signal Pd of the load W by the transfer function G(s).

[Formula 1]

$$G(s) = \frac{C_1}{(T_{1S}+1)} + \frac{C_2}{(T_{2S}+1)} + \frac{C_3}{(T_{3S}+1)} + \frac{C_4}{(T_{4S}+1)} \quad (1)$$

The target operating amount computation unit 36 corresponds to an example of the signal processing unit and an example of a second processing unit, and generates the target operating signal Md of each actuator from the attitude information of the crane 1, the current position information of the load W, and the target course signal Pdα of the load W using an inverse dynamics model. The target operating amount computation unit 36 has the inverse dynamics model.

The target operating amount computation unit 36 is connected is series to the target value filter 35. The target operating amount computation unit 36 computes the target position coordinate q(n+1) of the boom 9 after the lapse of the unit time t using the inverse dynamics model from the target course signal Pdα computed by the target value filter 35, the current position coordinate p(n) of the load W computed from the current position information of the load W acquired from the turning base camera 7b and the attitude information (the turning angle θz(n)) of the crane 1, the elongation/contraction length lb(n), the raising angle θx(n), and the fed-out amount l(n)) acquired from the respective sensors.

Next, the target operating amount computation unit 36 generates the target operating signal Md representing the target operating amount of each actuator from the target position coordinate q(n+1) computed in the inverse dynamics model. The target operating signal MA corresponds to an example of the signal related to the target operating amount.

The feedback control unit 37 generates the feedback operating signal Md1 that is a feedback operating amount of each actuator obtained by correcting the target operating signal Md on the basis of the difference between the target operating signal Md and the actual operating signal Mdr which represents the actual operating amount of each actuator with respect to the target operating signal Md. The actual operating signal Mdr corresponds to an example of the signal related to the operating amount of the actuator.

The feedback control unit 37 includes a feedback controller 38 that corrects the target operating signal Md. The feedback controller 38 is connected in series to the target operating amount computation unit 36. The feedback control unit 37 can acquire the actual operating signal Mdr from each sensor of the crane 1. The feedback control unit 37 is configured to feed back the actual operating signal Mdr to the target operating signal Md.

The feedback control unit 37 acquires the target operating signal Md of the load W from the target operating amount computation unit 36. In addition, the feedback control unit 37 acquires the actual operating signal Mdr from each sensor of the crane 1. The feedback control unit 37 feeds back (negatively feeds back) the acquired actual operating signal Mdr to the acquired target operating signal Md.

The feedback control unit 37 corrects the target operating signal Md by the feedback controller 38 on the basis of the difference between the actual operating signal Mdr and the target operating signal Md, and computes the feedback operating signal Md1.

The feedback control unit 37 computes the current position of the tip of the boom 9 (arm portion) from the turning angle of the boom 9 (arm portion) or the crane 1, the raising angle of the boom 9 (arm portion), and the elongation/contraction length of the boom 9 (arm portion). Further, the feedback control unit 37 computes the fed-out amount of the wire rope from the current position of the load and the current position of the tip of the boom 9 (arm portion) on the basis of the difference between the current position of the load and the target position of the load. Further, the feedback control unit 37 computes the direction vector of the wire rope from the current position of the load and the target position of the load. Further, the feedback control unit 37 computes the target position of the tip of the boom 9 (arm portion) at the target position of the load from the fed-out amount of the wire rope and the direction vector of the wire rope. Then, the feedback control unit 37 generates the feedback control signal on the basis of the target position of the tip of the boom 9 (arm portion). Specifically, the feedback control unit 37 computes a target speed signal of each actuator on the basis of changes in the target position of the tip of the boom 9 (arm portion) and the fed-out amount of the rope for each time, and generates the feedback control signal for correcting the target speed signal such that an actual response of the actuator of the crane matches the target speed signal.

The feed-forward control unit 39 is provided in parallel with the feedback control unit 37. The feed-forward control unit 39 generates the feed-forward operating signal Md2, which is a feed-forward operating amount of each actuator, from the attitude information of the crane 1, the current position information of the load W, and the target operating signal Md of the load W using a learning-type inverse dynamics model 40.

The feed-forward control unit 39 includes, for example, the learning-type inverse dynamics model 40 in which a plurality of characteristics of the crane 1 is represented by n subsystems. The learning-type inverse dynamics model 40 is connected in parallel to the target operating amount computation unit 36. In addition, in the learning-type inverse dynamics model 40, a plurality of subsystems, namely, a first subsystem SM1, a second subsystem SM2, a third subsystem SM3, and an nth subsystem SMn, are coupled in parallel. The subsystems SM1 to SMn correspond to an example of a subsystem group. In the present embodiment, one subsystem group corresponds to one actuator (for example, the turning hydraulic motor 8) of the crane 1. Although not illustrated, the feed-forward control unit 39 has the number of subsystem groups corresponding to the number actuators of the crane 1 to be controlled in the case of the present embodiment.

That is, the respective subsystems of the learning-type inverse dynamics mode 40 are connected in parallel with the feedback controller 38. In the learning-type inverse dynamics model 40, a weighting factor w1, a weighting factor w2, a weighting factor w3, . . . , and a weighting factor wn are assigned to the first subsystem SM1, the second subsystem SM2, the third subsystem SM3, . . . , and the nth subsystem SMn, respectively.

The feed-forward control unit 39 adjusts each of the weighting factors w1, w2, w3, . . . , and wn of the model on the basis of a signal (teaching signal) related to the difference of the actual operating signal Mdr from the target operating signal Md.

In this manner, the feed-forward control unit 39 is configured to be capable of learning the learning-type inverse dynamics model 40 having the characteristics of the crane 1 by adjusting the weighting factor of the learning-type inverse dynamics model 40.

The feed-forward control unit 39 acquires the target operating signal Md. In addition, the feed-forward control unit 39 acquires the difference between the actual operating signal Mdr and the target operating signal Md from the feedback control unit 37 as the teaching signal. The feed-forward control unit 39 adjusts each of the weighting factors w1, w2, w3 . . . , and wn of the model on the basis of the difference of the actual operating signal Mdr from the target operating signal Md.

That is, the feed-forward control unit 39 adjusts the weighting factor of one layer of the learning-type inverse dynamics model 40 on the basis of the difference between the target operating amount and the actual operating amount, whereby characteristics of each subsystem are adapted to the actual characteristics of the crane 1.

The feed-forward control unit 39 computes the target position coordinate q(n+1) of the boom 9 after the lapse of the unit time t using the learning-type inverse dynamics model 40 from the target operating signal Md, the current position coordinate p(n) of the load W computed from the current position information of the load W acquired from the turning base camera 7b and the attitude information (the turning angle θz(n)) of the crane 1, the elongation/contraction length lb(n), the raising angle θx(n), and the fed-out amount l(n)) acquired from the respective sensors.

Next, the feed-forward control unit 39 generates the feed-forward operating signal Md2 of each actuator from the computed target position coordinate q(n+1). The feed-forward control unit 39 adds the generated feed-forward operating signal Md2 to the feedback operating signal Md1.

The control system 34 of the crane 1 transmits the feedback operating signal Md1 computed by the feedback control unit 37 and the feed-forward operating signal Md2 computed by the feed-forward control unit 39 to each actuator of the crane 1. That is, the control system 34 controls the actuators to be controlled on the basis of the feedback operating signal Md1 and the feed-forward operating signal Md2.

After transmitting the feedback operating signal Md1 and the feed-forward operating signal Md2 to each actuator, the control system 34 subtracts the actual operating signal Mdr detected by each sensor of the crane 1 from the target operating signal Md by the feedback control unit 37. The control system 34 adjusts the weighting factor of the learning-type inverse dynamics model 40 on the basis of the difference of the actual operating signal Mdr from the target operating signal Md.

In the control system 34, the difference of the actual operating signal Mdr from the target operating signal Md decreases as the degree of deviation between the characteristics of the learning-type inverse dynamics model 40 of the feed-forward control unit 39 and the characteristics of the crane decreases. In addition, the control system 34 decreases the amount of adjustment of the weighting factor of the learning-type inverse dynamics model 40 as the difference of the actual operating signal Mdr from the target operating signal Md decreases.

That is, as the characteristics of the learning-type inverse dynamics model 40 are approximated to the characteristics of the crane 1 by learning, the proportion of control using the feedback operating signal Md1 computed by the feedback control unit 37 decreases, and the proportion of control using the feed-forward operating signal Md2 increases in the control system 34.

Next, feed-forward learning control of the crane 1 in the control system 34 will be described in detail with reference to FIGS. 6 to 8.

Figure 6:
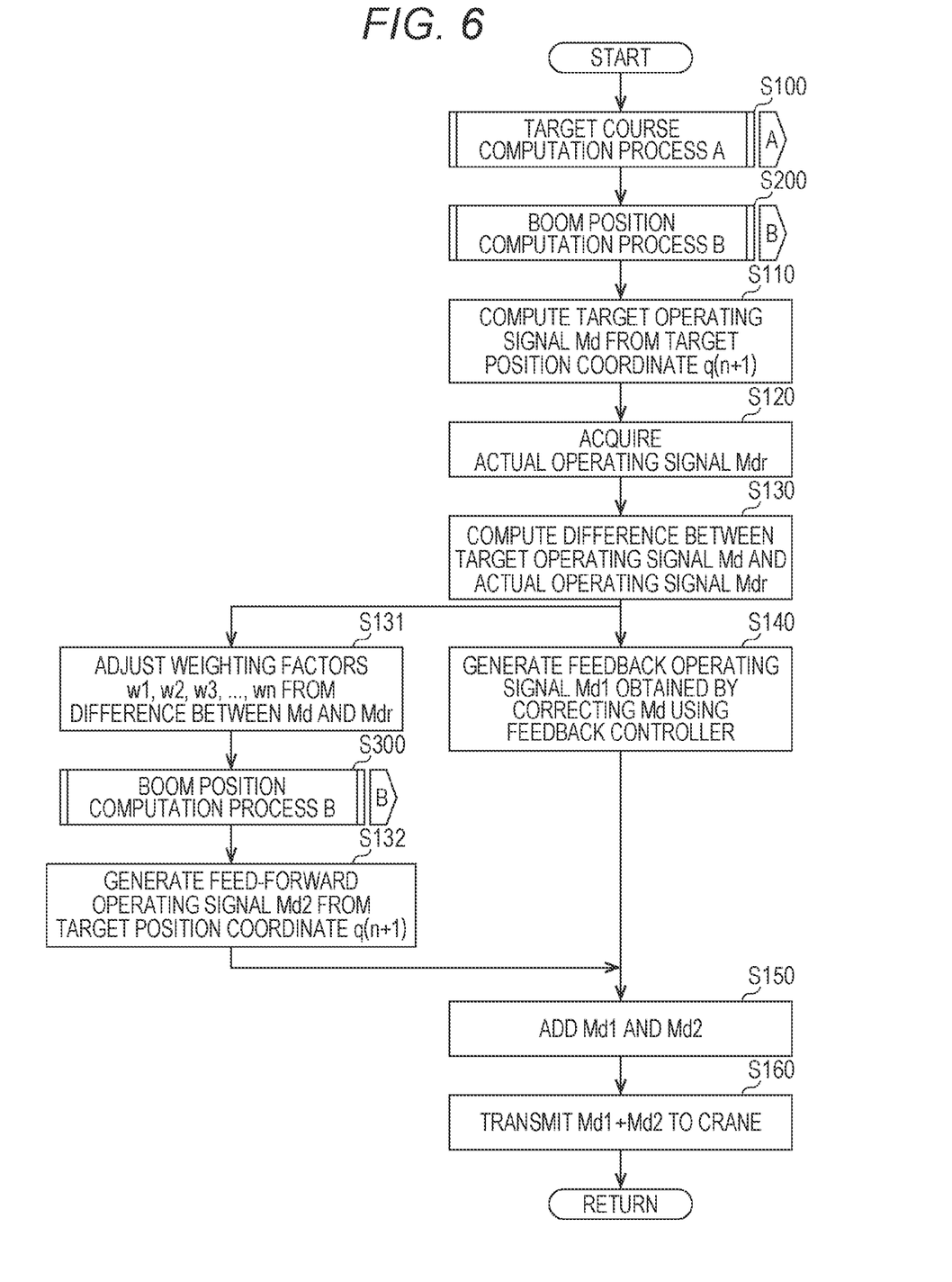
FIG. 6 is a view of a flowchart illustrating a control process of the crane.
Figure 7:
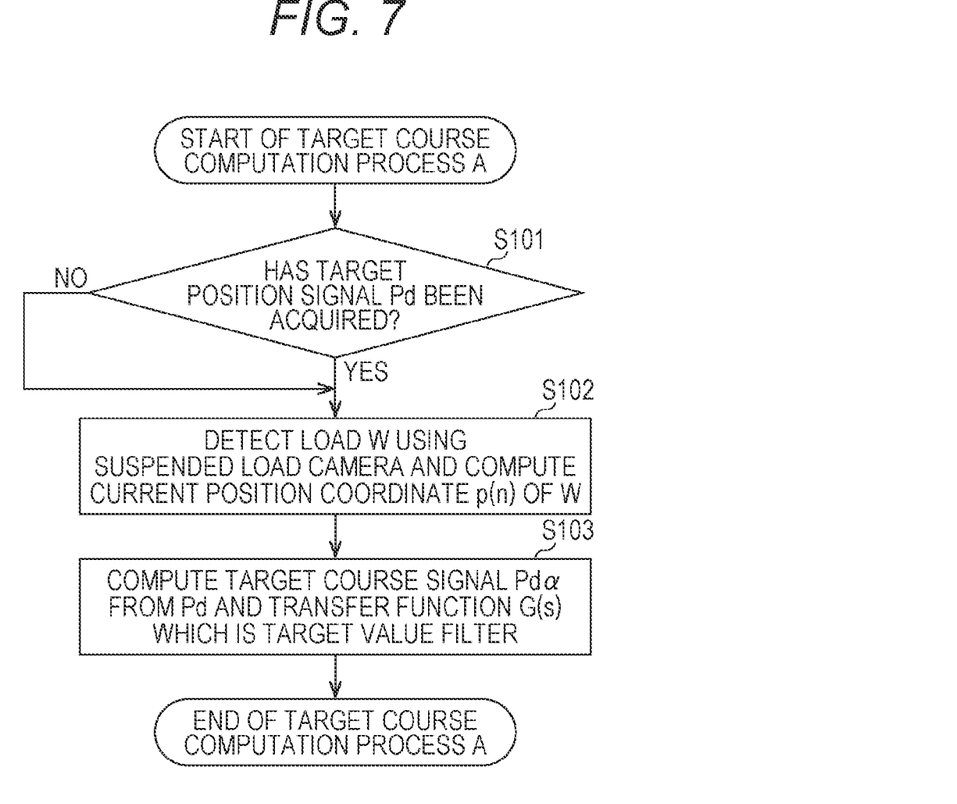
FIG. 7 is a view of a flowchart illustrating a target course computation process.

As illustrated in FIG. 6, in step S100, the control system 34 starts a target course computation process A and causes the step to transition to step S101 (see FIG. 7). Then, when the target course computation process A ends, the step transitions to transition to step S200 (see FIG. 6).

Figure 8:
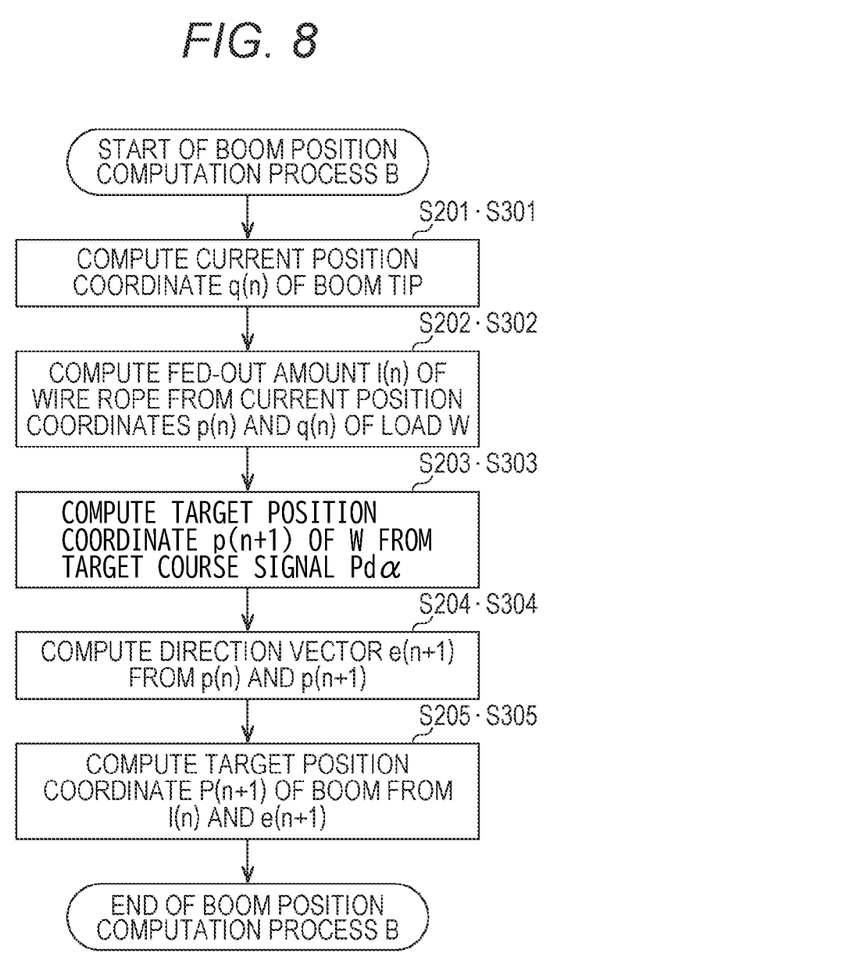
FIG. 8 is a view of a flowchart illustrating a boom position computation process.

In step S200, the control system 34 starts a boom position computation process B and causes the step to transition to step S201 (see FIG. 8). Then, when the boom position computation process B ends, the step transitions to step S110 (see FIG. 6).

As illustrated in FIG. 6, in step S110, the control system 34 computes the target operating signal Md from the computed target position coordinate q(n+1), and causes the step to transition to step S120.

In step S120, the control system 34 acquires the actual operating signal Mdr from each sensor of the crane 1, and causes the step to transition to step S130.

In step S130, the control system 34 computes a difference between the target operating signal Md and the actual operating signal Mdr, and causes the step to transition to step S140.

In step S140, the control system 34 generates the feedback operating signal Md1 obtained by correcting the target operating signal Md with the feedback controller 38 on the basis of the difference between the target operating signal Md and the actual operating signal Mdr, and causes the step to transition to step S150.

In step S131, the control system 34 adjusts the weighting factors w1, w2, w3, . . . , wn of the learning-type inverse dynamics model 40 from the difference between the target operating signal Md and the actual operating signal Mdr, and causes the step to transition to step S300.

In step S300, the control system 34 starts the boom position computation process B and causes the step to transition to step S301 (see FIG. 8). Then, when the boom position computation process B ends, the step transitions to step S132 (see FIG. 6).

In step S132, the control system 34 generates the feed-forward operating signal Md2 from the target position coordinate q(n+1), and causes the step to proceed to step S150.

In step S150, the control system 34 adds the feedback operating signal Md1 and the feed-forward operating signal Md2, and causes the step to transition to step S160.

In step S160, the control system 34 transmits a signal obtained by adding the feedback operating signal Md1 and the feed-forward operating signal Md1 to each actuator of the crane 1, and causes the step to transition to step S100.

As illustrated in FIG. 7, in step S101, the control system 34 determines whether or not the target movement position signal Pd, obtained by converting the target moving speed signal Vd by the integrator 32a, has been acquired. Here, the target moving speed signal Vd is a signal generated on the basis of the lever operation of the operator, and is a signal for instructing the moving direction and the moving speed of the load. That is, the target moving speed signal Vd is not a signal for instructing the position of the crane 1 (load). Therefore, the target moving speed signal Vd is integrated by the integrator 32a to be converted into the target movement position signal Pd in the case of the present embodiment. The target movement position signal Pd is the pulse-shaped (step-shaped) signal. When the target movement position signal Pd has been acquired in step S101 ("YES" in step S101), control system 34 causes the step to transition to step S102. On the other hand, when target movement position signal Pd has not been acquired ("NO" in step S101), control system 34 causes the step to transition to step S101.

In step S102, the control system 34 detects the load W using the boom camera 9b, computes the current position coordinate p(n) of the load W, and causes the step to transition to step S103.

In step S103, the control system 34 computes the target course signal Pdα from the acquired target movement position signal Pd and the transfer function G(s), which is the target value filter 35, ends the target course computation process A, and causes the step to transition to step S200. Here, the target course signal Pdα may be regarded as position information complementing a gap between the target movement position signals Pd, which are pieces of discrete position information, and course (path) information obtained by adding time information to the position information.

As illustrated in FIG. 8, the control system 34 computes the current position coordinate q(n) of the tip of the boom 9 from the turning angle θz(n) of the turning base 7, the elongation/contraction length lb(n), and the raising angle θx(n) of the boom 9 acquired by the boom position computation unit 31b in steps S201 and S301, and causes the step to transition to steps S202 and S302.

In steps S202 and S302, the control system 34 causes the boom position computation unit 31b to compute the fed-out amount l(n) of the wire rope from the current position coordinate p(n) of the load d and the current position coordinate q(n) f the boom 9 using the above Formula (4), and causes the step to transition to steps S203 and S303.

In steps S203 and S303, the control system 34 causes the boom position computation unit 31b to compute the target position coordinate p(n+1) of the load W, which is the target position of the load W after the lapse of the unit time t from the target course signal Pdα, with the current position coordinate p(n) of the load d as the reference, and causes the step to transition to steps S204 and S304.

In steps S204 and S304, the control system 34 causes the boom position computation unit 31b to compute the acceleration of the load W from the current position coordinate p(n) of the load F and the target position coordinate p(n+1) of the load W, computes the direction vector e(n+1) of the wire rope using the gravitational acceleration and the above Formula (5), and causes the step to transition to steps S205 and S305.

In steps S205 and S305, the control system 34 causes the boom position computation unit 111 to compute the target position coordinate q(n+1) of the boom 9 from the computed wire rope fed-out amount l(n) and direction vector e(n+1) of the wire rope using the above Formula (6), ends the boom position computation process B, and causes the step to transition to step S110 or step S132 (see FIG. 6).

The control system 34 of the crane 1 repeats the target course computation process A and the boom position computation process B to compute the target position coordinate q(n+1) of the boom 9 and compute a direction vector e(n+2) of the wire rope from a fed-out amount l(n+1) of the wire rope, the current position coordinate p(n+1) of the load W, and a target position coordinate p(n+2) of the load W after a lapse or the unit time t.

In addition, the control system 34 further computes a target position coordinate q(n+2) of the boom 9 after the lapse of the unit time t from the fed-out amount l(n+1) of the wire rope and the direction vector e(n+2) of the wire rope.

That is, the control system 34 computes the direction vector e(n) of the wire rope, and uses the inverse dynamics to sequentially compute the target position coordinate q(n+2) of the boom 9 after the lapse of the unit time t from the current position coordinate p(n+1) of the load W, the target position coordinate p(n+2) of the load W, and the direction vector e(n+2) of the wire rope.

The control system 34 generates the target operating signal Md on the basis of the target position coordinate q(n+2) of the boom 9 and controls each actuator.

In this manner, the learning-type inverse dynamics model 40 of the control system 34 includes the plurality of subsystems having apparent physical characteristics. In addition, the learning-type inverse dynamics model 40 can be regarded as a one-layer neural network by multiplying outputs from the plurality of subsystems by respective weighting factors.

The learning-type inverse dynamics model 40 can make physical characteristics of the first subsystem SM1, the second subsystem SM2, the third subsystem SM3, ..., and the nth subsystem SMn to be approximated to the characteristics of the crane 1 by adjusting the weighting factors w1, w2, w3, ..., and wn independently on the basis of the difference between the target operating signal Md and the actual operating signal Mdr.

In this manner, the control system 34 of the crane 1 identifies the weighting factors w1, w2, w3, ..., and wn of the learning-type inverse dynamics model 40 while flexibly responding to changes in dynamic characteristics of the crane 1 during the operation of the crane 1. That is, in the control system 34, a high-order transfer function is adjusted for each of the plurality of low-order subsystems, namely, first subsystem SM1, second subsystem SM2, third subsystem SM3, ..., and nth subsystem SMn.

As a result, when the actuator is controlled with the load N as a reference, the control system 34 can move the load W in a mode according to the operator's intention while suppressing the swinging of the load W by learning the dynamic characteristics of the crane 1 from the motion of the load W. Note that, although the control system 34 includes the learning-type inverse dynamics model 40 as the plurality of subsystems in the present embodiment, any other model with apparent physical characteristics may be included.

In addition, the control system 34 generates the target course signal Pdα to be input to the learning-type inverse dynamics model 40 through the target value filter 35 which is the fourth order low-pass filter and, thus, the generation of the singular point in the target course signal Pdα is suppressed. Therefore, the control system 34 inputs the target course signal Pdα in which the singular point has been suppressed to the learning-type inverse dynamics model 40, thereby promoting convergence of learning of the learning-type inverse dynamics model 40. As a result, when the actuator is controlled with the load W as the reference, the control system 34 can move the load W in a mode according to the operator's intention while suppressing the swinging of the load W.

The above-described embodiment merely illustrates a typical form, and various modifications can be implemented within a scope not departing from a gist of the embodiment. Needless to say, the present invention can be implemented in various forms, and the scope of the present invention encompasses those illustrated in the description of the claims, those having meanings equivalent to those in the claims, and all alterations within the scope.

INDUSTRIAL APPLICABILITY

The present invention is applicable to various cranes as well as the mobile crane.

REFERENCE SIGNS LIST 1 crane
2 vehicle
3 wheel
4 engine
5 outrigger
6 crane device
7 turning base
7b turning base camera
8 turning hydraulic motor
9 boom
9a jib
10 main hook block
10a main hook
11 sub hook block
11a sub hook
12 raising hydraulic cylinder
13 main winch
14 main wire rope
15 sub winch
16 sub wire rope
17 cabin
18 turning operation tool
19 raising operation tool
20 elongation/contraction operation tool
21m main drum operation tool
21s sub drum operation tool
23 turning valve
24 elongation/contraction valve
25 raising valve
26m main valve
26s sub valve
27 turning sensor
28 elongation/contraction sensor
29 azimuth sensor
30 raising sensor
31 control device
31a target course computation unit
31b boom position computation unit
31c operating signal generation unit
32 load moving operation tool
32a integrator
33 winding sensor
34 control system
35 target value filter
36 target operating amount computation unit
37 feedback control unit
39 feed-forward control unit
38 feedback controller
40 learning-type inverse dynamics model
51 elongation/contraction hydraulic cylinder
52 main hydraulic motor
53 sub hydraulic motor
W load
Vd target moving speed signal
Pd target movement position signal
Pdα target course signal
w1, w2, w3, w4 weighting factor

The invention claimed is:

1. A control system for controlling an actuator of a crane, the control system comprising:
a signal processing unit that generates a signal related to a target operating amount of the actuator;
a feedback control unit that controls the actuator based on a difference between the signal related to the target operating amount and a fed-back signal related to an operating amount of the actuator; and
a feed-forward control unit that performs feed-forward control of the actuator based on the signal related to the target operating amount in cooperation with the feedback control unit and performs adjustment of a weighting factor of a learning-type inverse dynamics model based on a teaching signal, to learn characteristics of the actuator, the learning-type inverse dynamics model representing the characteristics of the actuator, the feed-forward control of the actuator and the learning of the characteristics of the actuator by the adjustment of the weighting factor of the learning-type inverse dynamics model being performed at a same time, wherein
the signal processing unit removes a pulse-shaped component from an input signal to convert the input signal into the signal related to the target operating amount,
the teaching signal is the difference between the signal related to the target operating amount and the fed-back signal related to the operating amount, and
the feed-forward control unit:
computes a current position of a tip of an arm portion from a turning angle of the arm portion in the crane, a raising angle of the arm portion, and an elongation/contraction length of the arm portion;
adjusts the weighting factor, based on a difference of a current position of a load from a target position of the load;
computes a fed-out amount of a wire rope from the current position of the load and the current position of the tip of the arm portion;
computes a direction vector of the wire rope from the current position of the load and the target position of the load;
computes a target position of the tip of the arm portion at the target position of the load from the fed-out amount of the wire rope and the direction vector of the wire rope; and
generates a feed-forward control signal, based on the target position of the tip of the arm portion.

2. The control system according to claim 1, further comprising a pre-processing unit that generates a signal related to a target movement position of a load from a signal related to a target speed of the load, the signal related to the target movement position of the load being the input signal and having the pulse-shaped component.

3. The control system according to claim 1, wherein the signal processing unit includes:
a first processing unit that removes a frequency equal to or higher than a predetermined value from the input signal to generate a signal related to a target course of a load; and
a second processing unit that generates the signal related to the target operating amount, based on the signal related to the target course.

4. The control system according to claim 3, wherein the first processing unit includes a low-pass filter.

5. The control system according to claim 4, wherein a transfer function of the low-pass filter is expressed by Formula (1):

[Formula 1]

$$G(s) = \frac{C_1}{(T_1 s + 1)} + \frac{C_2}{(T_2 s + 1)} + \frac{C_3}{(T_3 s + 1)} + \frac{C_4}{(T_4 s + 1)} \quad (1)$$

where T1, T2, T3, T4, C1, C2, C3, and C4 are coefficients and s is a differential element.

6. The control system according to claim 1, wherein the feedback control unit and the feed-forward control unit are provided in parallel to each other and in series with the signal processing unit.

7. The control system according to claim 1, wherein the feedback control unit:
computes the fed-out amount of the wire rope from the current position of the load and the current position of the tip of the arm portion, based on a difference of a current position of the load from a target position of the load; and
generates a feedback control signal, based on the target position of the tip of the arm portion.

8. The control system according to claim 1, wherein
the feed-forward control unit includes a plurality of subsystem groups each including a plurality of subsystems, in the learning-type inverse dynamics model, and
each of the plurality of subsystem groups is provided in association with each of a plurality of the actuators.

9. The control system according to claim 8, wherein the plurality of the actuators includes an actuator for turning a boom included in an arm portion of the crane, an actuator for raising the boom, an actuator for elongating and contracting the boom, and an actuator for lifting and lowering a hook of the crane.

10. A crane comprising the control system according to claim 1.

* * * * *